(12) United States Patent
Ritter

(10) Patent No.: US 6,655,600 B1
(45) Date of Patent: Dec. 2, 2003

(54) OSCILLATOR AND TELECOMMUNICATIONS SYSTEM WITH SUCH AN OSCILLATOR

(75) Inventor: Rudolf Ritter, Zollikofen (CH)

(73) Assignee: Swisscom Mobile AG, Bern (SE)

( * ) Notice: Subject to any disclaimer, the term of this patent is extended or adjusted under 35 U.S.C. 154(b) by 0 days.

(21) Appl. No.: 09/857,127
(22) PCT Filed: Dec. 1, 1998
(86) PCT No.: PCT/CH98/00506
§ 371 (c)(1), (2), (4) Date: Aug. 17, 2001
(87) PCT Pub. No.: WO00/33456
PCT Pub. Date: Jun. 8, 2000

(51) Int. Cl.$^7$ .............................................. G06K 19/06
(52) U.S. Cl. ..................... 235/492; 235/436; 235/441
(58) Field of Search ................. 235/441, 436, 235/492; 365/51, 63; 375/325, 326, 327; 367/100, 127; 372/108, 6, 50, 92

(56) References Cited

U.S. PATENT DOCUMENTS

| | | | | |
|---|---|---|---|---|
| 3,694,656 A | * | 9/1972 | Henning | 359/325 |
| 4,767,918 A | * | 8/1988 | Kushima et al. | 235/441 |
| 4,873,697 A | * | 10/1989 | Haeussler et al. | 372/108 |
| 5,283,777 A | * | 2/1994 | Tanno et al. | 369/108 |
| 5,490,176 A | * | 2/1996 | Peltier | 375/325 |
| 5,497,385 A | | 3/1996 | Schmuck | 372/6 |
| 5,652,539 A | * | 7/1997 | Zanders et al. | 327/539 |
| 5,679,944 A | * | 10/1997 | Cusey et al. | 235/492 |
| 5,745,437 A | * | 4/1998 | Wachter et al. | 367/100 |
| 5,815,426 A | * | 9/1998 | Jigour et al. | 365/51 |
| 5,923,452 A | * | 7/1999 | Carlson | 359/172 |
| 6,240,274 B1 | * | 5/2001 | Izadpanah | 455/39 |
| 6,370,374 B1 | * | 4/2002 | Eichinger et al. | 455/411 |

FOREIGN PATENT DOCUMENTS

| | | |
|---|---|---|
| FR | 2 642 533 | 8/1990 |
| GB | 2 308 528 | 6/1997 |

OTHER PUBLICATIONS

Braun R–P et al: "Low–Phase–Noise Millimeter–Wave Generation at 64 GHZ and Data Transmission Using Optical Sideband Injection Locking" IEEE Photonics Technology Letters, vol. 10, No. 5, May 1, 1998, pp. 728–730, XP000754669 issn; 1041–1135 cited in the application, p. 728, col. 1,—p. 729, col. 2, line 6; figure 1.

* cited by examiner

Primary Examiner—Michael G. Lee
Assistant Examiner—Kimberly Nguyen
(74) Attorney, Agent, or Firm—Oblon, Spivak, McClelland, Maier & Neustadt, P.C.

(57) ABSTRACT

The oscillator integrated into a chip can generate an electrical clock signal with a reference signal, wherein the chip contains the following components: at least one laser transmitter, which can generate two coherent light signals with a differing optical transmission frequency, a coupler, in order to merge the two light signals, an electromagnetic converter, which can generate an electrical signal, whose frequency corresponds to the distance between the two transmission frequencies, a frequency divider, which can divide the frequency of the electrical signal in order to deliver a clock signal with a lower frequency. The oscillator can be inserted into a SIM card, for example, in order to make possible a non-falsifiable determination of the connection duration.

23 Claims, 1 Drawing Sheet

OSCILLATOR AND TELECOMMUNICATIONS SYSTEM WITH SUCH AN OSCILLATOR

This application is the National Phase of International Application PCT/CH98/00506 filed Dec. 1, 1998 which designated the U.S. and that International Application was not published under PCT Article 21 (2) in English.

BACKGROUND OF THE INVENTION

1. Field of the Invention

This invention relates to a chipcard with an oscillator (8) integrated hereon. In particular, the invention also relates to telecommunications systems and telecommunications methods, which use such a chipcard.

2. Description of Related Art

Many portable, electronic devices require a miniaturized oscillator, which can generate a signal with a stable frequency. Crystal oscillators are frequently used for this purpose since they need little current and can easily be integrated into small devices, for example wristwatches.

A great many attempts have already been made to integrate a crystal oscillator together with various other electronic components, for example a frequency divider, into a single chip. The patent documents DE 4011795, U.S. Pat. No. 5,406,230 and U.S. Pat. No. 5,229,640, for example, describe various solutions to achieve this object. In practice, many difficulties still have to be overcome before a really reliable, inexpensive and miniaturized crystal oscillator comes on the market.

BRIEF SUMMARY OF THE INVENTION

It is therefore an object of the invention to propose an improved oscillator, which can be integrated into a chip of minimal dimensions, and which can be inserted, for example, into a chipcard, including a chipcard of the "plug-in" format, as are used, for example, in mobile radio telephones (SIM cards).

Another object is to propose a new integrated oscillator which can generate a reference signal with a frequency that cannot be falsified, and which can be used, for example, for secure applications where a non-falsifiable determination of the time is required.

A further object is to achieve a chipcard with an integrated oscillator, with which the duration of certain processes, for example the duration of telephone calls in the case of a SIM card, can be established.

According to the invention these objects are attained with the aid of a device as described in the independent device claim and with a method as described in the independent method claim, various variants being described in the dependent claims.

In particular these objects are achieved with the aid of a new integrated oscillator with which an electrical signal is generated from an interference between two coherent light signals, the light signals being generated with one or more integrated laser transmitters.

R. P. Braun et al. describe in "Low-Phase-Noise Millimeter-Wave Generation at 64 GHz and Data Transmission Using Optical Sideband Injection Locking," *IEEE Photonics Technology Letters*, Vol. 10, No. 5, May 1998, the possibility of generating signals with a frequency of only some megahertz from an interference between two laser signals. The described device is intended for base stations in a mobile radio network; however, it is not indicated in this document that integrated laser sources can also be used.

Other experiments in generating microwave signals from an interference between laser signals have also been described by R. P. Braun et al. in "Optical Harmonic Upconversion for Microwave Generation in Bidirectional Broadband Mobile Communication System, " *Electronics Letters*, Vol. 33, No. 22, Oct. $23^{rd}$ 1997, and by R. P. Braun et al. in "Optical Microwave Generation and Transmission Experiments in the 12- and 60-GHz Region for Wireless Communications," *IEEE Transactions on Microwave Theory and Techniques*, Vol. 46, No. 4, Apr. 1998. Although all these documents concern the generation of signals in the microwave range (for example signals with a frequency of 12 or 60 GHz), signals with a lower frequency can also be generated with the same principle, for example signals which can be processed by conventional, digital logic circuits.

BRIEF DESCRIPTION OF THE DRAWINGS

The present invention will be better understood with the aid of the description, given as an example, and illustrated by the figures.

DETAILED DESCRIPTION OF THE INVENTION

Figure 1:
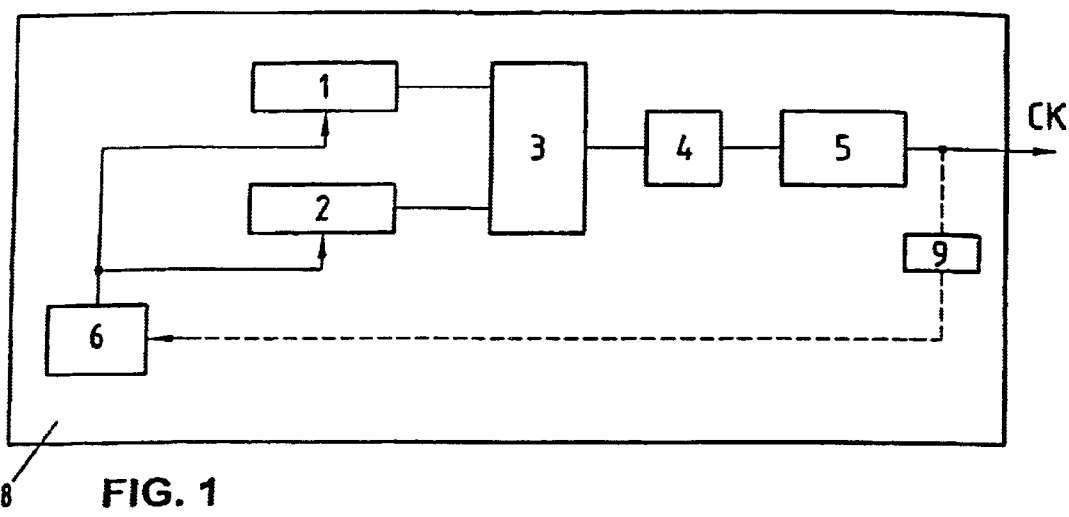
FIG. 1 is a block diagram showing an oscillator according to the invention.

FIG. 1 shows diagrammatically the most important components of an oscillator 8 according to the invention. The oscillator 8 comprises in the example shown two integrated laser transmitters 1, 2, which generate two coherent light signals with two close-together optical transmission frequencies. Integrated lasers, which are achieved with semiconductor technology, and which can be integrated into chips, are already known, and were described, inter alia, by Jens Uwe Nöckel in the Neue *Zürcher Zeitung* of Jun. $24^{th}$ 1998, page 69, or by Christian Wyss in the Neue *Züircher Zeitung* of Aug. $12^{th}$ 1998. They are based, for example, on an oval resonator of about 10 to 80 micrometers in diameter or on diode-pumped solid state lasers.

The transmitted light beams are directed to an optional optical coupler 3, which is also integrated into the chip, and which can simply consist of, for example, a transparent glass element. An interference between the two light beams from the two laser sources 1, 2 is generated in this way in the coupler 3, the frequency of the resultant electromagnetic wave corresponding to the difference between the optical transmission frequency of the two laser transmitters 1, 2.

If a frequency separation of between 100 MHz and 10 GHz, preferably however between 500 MHz and 1 GHz, is selected, an electromagnetic wave is generated in the coupler 3 with a wavelength of between approximately 0.1 and 1 millimeter. This wave is received by an electromagnetic converter 4, which preferably consists of a simple integrated receiving antenna, and supplies an initial current with a frequency corresponding to the frequency separation between the two transmitted light beams.

The high frequency signal, which is generated by the antenna 4, is given to a frequency divider 5, which, at its output, emits a digital reference signal CK with a lower frequency, for example a 32 KHz signal. This signal can be used, for example, for the synchronization of clocks, watches or time-measuring devices.

The transmission frequency of the two laser transmitters 1, 2 is preferably stabilized with a frequency stabilizing element 6, which, for example, controls the current injected in the two laser transmitters 1, 2. In a variant, a Peltier element (not shown) is used to control electronically the temperature of the chip and of the two transmitters 1, 2, so that the transmission frequency remains stable. The injected current in the Peltier element is likewise preferably controlled by the stabilizing element 6.

The stabilizing element 6 is preferably controlled by a feedback signal, which is generated by a frequency voltage converter 9, whereby the converter 9 delivers a voltage which is proportional to the frequency of the signal CK at the output of the frequency divider 5. In this way the transmission frequency of the two laser transmitters 1, 2 is controlled by the frequency of the signal CK at the output of the entire system.

In a further embodiment variant of the invention, a single laser transmitter is used, which generates two different close-together frequencies (dual mode laser). In this case most of the frequency deviations or jumps of the two laser beams occur simultaneously, so that the frequency separation remains extraordinarily stable.

Further methods of obtaining an interference between two coherent laser beams from a single light source are described, inter alia, by R. P. Braun et al. in "Optical Millimeter-Wave Systems for Broadband Mobile Communications, Devices and Techniques," *International Zurich Seminar on Broadband Communications-Accessing, Transmission, Networking*, ETH Zurich, Switzerland, Feb. 1998. Known, for example, are sideband-modulation techniques and mode locked lasers (MLL).

Figure 2:
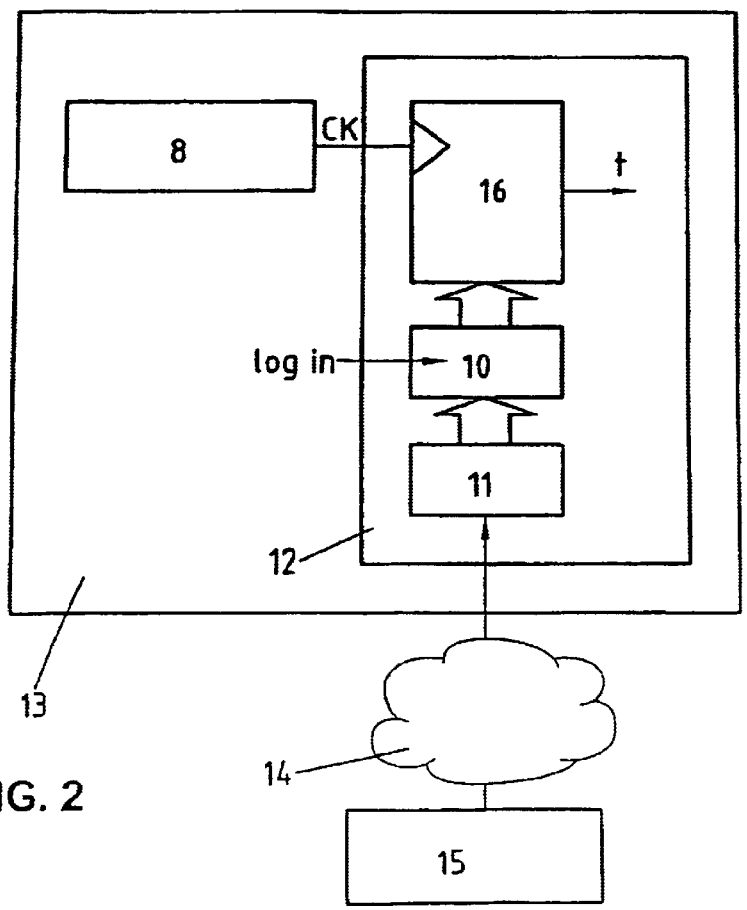
FIG. 2 is a block diagram showing an identification card according to the invention in a mobile communications system.

FIG. 2 shows an identification card 13, for example a SIM card for mobile radio devices, which contains an oscillator 8 according to the invention. The reference signal CK, which is generated by the oscillator 8 described above, is emitted at the clock input of a counter 16 of known type. At the output, the counter gives a time indication t, which depends upon the number of received pulses of the signal CK. The time indication can correspond, for example, to the absolute time or to the duration since the beginning of a process, for example the duration of a telephone connection.

The value in the counter 16 can be initialized with an initialization value stored in an initialization register 10, for example, upon switching on or logging the card into a telecommunications network 14. The initialization value in the initialization register can be remotely loaded from a time server 15, which can send time documents to the card 13. The time documents are transmitted preferably by means of USSD short messages via a GSM mobile radio network 14, and are filed in a protected memory zone 11 of the card 13; other types of data messages and of telecommunications systems can also be used, however. Cryptographic mechanisms are preferably used in order to sign the transmitted messages and to prevent falsifications. The Swiss patent application No. 367/98 describes other processes to set the time t in the counter 16 when logging in the card.

The counter 16 and the registers 10 and 11 are preferably located in a protected zone 12 of the card 13, so that the indicated value t emitted by the counter 16 cannot be falsified. Of course the user also has no possibility of influencing the frequency signal CK emitted by the oscillator 8 or of setting it from outside.

The time indication t delivered by the counter 16 can be used, for example, to determine the duration and the price of telephone calls. This way the determined amount can be booked immediately against the account of a prepaid SIM card, or can be packed in a signed document and transmitted to a financial services provider (bank or network operator). The card according to the invention can also be used to measure the duration of other processes in the card 13, for example the duration of use of certain services or applications or the use of resources not responsible for traffic flow.

It is also possible, moreover, to use chipcards for applications other than mobile telephony. Such chipcards can also be used, for example, for pay TV systems or in networked computers, for example to make out a use-time-dependent bill, which depends upon the time of use or the duration of use.

The oscillator 8 cannot supply a reference signal CK until it is fed with electricity, for example when the card is inserted into a switched-on mobile device. The counter 16 must then be set again after each switching on of the mobile device. To avoid this drawback, it is also possible to provide the card with an energy store, for example a battery, so that the card is electrically autonomous.

One skilled in the art will understand that the oscillator according to the invention can also be used in other portable mobile devices, for example to generate a reference signal in a clock.

What is claimed is:

1. A chipcard with an oscillator integrated into a chip, the oscillator being arranged to generate an electrical clock signal with a reference frequency,
    wherein said oscillator comprises the following components:
        at least one laser transmitter arranged to generate two coherent light signals with a differing optical transmission frequency,
        an electromagnetic converter arranged to convert the wave generated from an interference between the two said light signals into an electrical signal, and
        a frequency divider arranged to divide the frequency of said electrical signal in order to emit a clock signal with a lower frequency.

2. The chipcard according to claim 1, wherein said at least one laser transmitter consists of a semiconductor micro-laser.

3. The chipcard according to claim 2, wherein said at least one semiconductor micro-laser contains an oval resonator.

4. The chipcard according to claim 2, wherein said at least one semiconductor micro-laser contains an optically pumped, solid-state laser.

5. The chipcard according to claim 1, wherein said oscillator contains two different laser transmitters, which generate two coherent light signals with differing optical transmission frequencies.

6. The chipcard according to claim 1, wherein the said oscillator contains a single laser transmitter, which has two transmission modes.

7. The chipcard according to claim 1, further comprising a stabilizing element to stabilize the said optical transmission frequency of the said at least one laser transmitter.

8. The chipcard according to claim 7, wherein said stabilizing element is controlled with the frequency of the said clock signal.

9. The chipcard according to claim 7, further comprising a Peltier element in order to control the temperature of said at least one laser transmitter.

10. The chipcard according to claim 9, wherein the current, which is injected into said Peltier element, is dependent upon the frequency of said clock signal.

11. The chipcard according to claim 1, further comprising a counter, and said clock signal is applied at the clock impulse input of said counter.

12. The chipcard according to claim 11, further comprising an initialization register in which an initialization value for said counter can be stored.

13. The chipcard according to claim 12, wherein the chipcard is an identification card to identify subscribers in a telecommunications network.

14. The chipcard according to claim 13, wherein the value in the said initialization register can be changed with short messages transmitted via the said telecommunications network.

15. The chipcard according to claim 13, further comprising an energy store which feeds the oscillator.

16. The chipcard according to claim 13, wherein said registers are stored in an area of the identification card not accessible to the subscriber.

17. A billing method for billing a call of a subscriber identified with an identification card in a telecommunications network to the subscriber, comprising the steps of:

determining the duration of the call using a time-measuring device integrated into the identification card, the time-measuring device comprising an integrated oscillator for generating an electrical clock signal with a reference frequency, the reference frequency being generated from an interference between two coherent laser signals, and the measured duration of the call being determined based on the reference frequency; and determining the amount to be billed based on the duration of the call measured with the time measuring device.

18. The billing method according to claim 17, wherein a time controller in the telecommunications network checks the set time after each logging in of an identification card, and, if the time is not correctly set, transmits a time document to this identification card.

19. The billing method according to claim 18, wherein the transmitted time documents are electronically signed.

20. The billing method according to claim 17, wherein the determined amounts are booked directly against a prepaid account in the identification card.

21. The billing method according to claim 17, wherein the determined amounts are packed in a signed document, and are transmitted to a is financial services provider.

22. The billing method according to claim 17, wherein the use of resources in the identification card not responsible for the communications transaction are billed as a function of the tariff tables and the said time-measuring device.

23. A chipcard comprising:

an oscillator integrated into a chip, the oscillator including, means for generating two coherent light signals with a differing optical transmission frequency, means for converting the wave generated from an interference between the two said light signals into an electrical signal, and means for dividing the frequency of said electrical signal in order to emit a clock signal with a lower frequency.

* * * * *

UNITED STATES PATENT AND TRADEMARK OFFICE
CERTIFICATE OF CORRECTION

PATENT NO. : 6,655,600 B1
DATED : December 2, 2003
INVENTOR(S) : Ritter

It is certified that error appears in the above-identified patent and that said Letters Patent is hereby corrected as shown below:

<u>Title page,</u>
Item [73], Assignee, should read:
-- [73] Assignee: Swisscom Mobile AG, Bern (CH) --

Signed and Sealed this

Eleventh Day of May, 2004

JON W. DUDAS
*Acting Director of the United States Patent and Trademark Office*